United States Patent
Tychkov (10) Patent No.: US 9,360,762 B2
(45) Date of Patent: Jun. 7, 2016

(54) ILLUMINATION SYSTEM, LITHOGRAPHIC APPARATUS AND METHOD

(75) Inventor: Andrey Sergeevich Tychkov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 549 days.

(21) Appl. No.: 13/361,397

(22) Filed: Jan. 30, 2012

(65) Prior Publication Data

US 2012/0194794 A1  Aug. 2, 2012

Related U.S. Application Data

(60) Provisional application No. 61/438,943, filed on Feb. 2, 2011, provisional application No. 61/471,773, filed on Apr. 5, 2011.

(51) Int. Cl.
*G03B 27/54* (2006.01)
*G03F 7/20* (2006.01)

(52) U.S. Cl.
CPC .................................. *G03F 7/70116* (2013.01)

(58) Field of Classification Search
CPC ............ G03F 7/70116; G03F 7/70091; G03F 7/70191
USPC .................. 355/67, 70, 71; 359/627, 622, 623
See application file for complete search history.

(56) References Cited

U.S. PATENT DOCUMENTS

| 5,594,752 | A | * | 1/1997 | Endriz | ....................... | B41J 2/45 346/141 |
| 6,373,633 | B1 | | 4/2002 | Brown | | |
| 6,737,662 | B2 | | 5/2004 | Mulder et al. | | |
| 8,004,766 | B2 | | 8/2011 | Tanaka et al. | | |
| 8,416,390 | B2 | | 4/2013 | Deguenther et al. | | |
| 8,792,081 | B2 | * | 7/2014 | Owa | .................... | G03F 7/70116 250/205 |
| 8,885,144 | B2 | | 11/2014 | Claessens et al. | | |
| 9,116,439 | B2 | | 8/2015 | Mulder et al. | | |
| 2002/0084428 | A1 | | 7/2002 | Visser et al. | | |
| 2002/0136351 | A1 | * | 9/2002 | Singer | .................... | B82Y 10/00 378/34 |
| 2004/0108467 | A1 | | 6/2004 | Eurlings et al. | | |
| 2004/0252938 | A1 | * | 12/2004 | Ducellier | ........... | G02B 6/12011 385/27 |
| 2007/0058274 | A1 | | 3/2007 | Singer et al. | | |
| 2007/0165202 | A1 | * | 7/2007 | Koehler et al. | ................. | 355/67 |

(Continued)

FOREIGN PATENT DOCUMENTS

CN  101504126 A  8/2009
JP  2003-280094 A  10/2003

(Continued)

*Primary Examiner* — Deoram Persaud
(74) *Attorney, Agent, or Firm* — Sterne, Kessler, Goldstein & Fox P.L.L.C.

(57) ABSTRACT

An illumination system comprising an array of controllable mirrors configured to direct radiation towards a pupil plane and an array of lenses configured to direct radiation sub-beams towards the array of controllable mirrors, wherein a first lens of the array of lenses and a controllable mirror of the array of controllable mirrors forms a first optical channel having a first optical power and a second lens of the array of lenses and a controllable mirror of the array of controllable mirrors forms a second optical channel having a second optical power, such that a radiation sub-beam formed by the first optical channel has a first cross-sectional area and shape at the pupil plane and a radiation sub-beam formed by the second optical channel has a second different cross-sectional area and/or shape at the pupil plane.

28 Claims, 7 Drawing Sheets

(56) References Cited

U.S. PATENT DOCUMENTS

| | | |
|---|---|---|
| 2008/0239268 A1 | 10/2008 | Mulder et al. |
| 2009/0010305 A1 | 1/2009 | Meijer et al. |
| 2009/0059394 A1 | 3/2009 | Scaggs |
| 2010/0020300 A1 | 1/2010 | Bouman et al. |
| 2010/0231880 A1 | 9/2010 | Kawabe |
| 2011/0102758 A1* | 5/2011 | Schwab ............. G03F 7/70075 355/67 |
| 2012/0002184 A1 | 1/2012 | Bader |
| 2012/0099093 A1 | 4/2012 | Patra et al. |
| 2012/0249988 A1* | 10/2012 | Runde ............... G03F 7/70108 355/67 |

FOREIGN PATENT DOCUMENTS

| | | |
|---|---|---|
| JP | 2005-236088 A | 9/2005 |
| JP | 2007-500432 A | 1/2007 |
| JP | 2010-034553 A | 2/2010 |
| JP | 2010-525589 A | 7/2010 |
| JP | 2011-199285 A | 10/2011 |
| JP | 2011-249798 A | 12/2011 |
| JP | 2012-104813 A | 5/2012 |
| KR | 10-2002-0077521 | 10/2002 |
| KR | 10-2007-0068361 | 6/2007 |
| TW | 201042364 A1 | 12/2010 |

* cited by examiner

ILLUMINATION SYSTEM, LITHOGRAPHIC APPARATUS AND METHOD

CROSS REFERENCE TO RELATED APPLICATIONS

This application claims the benefit under 35 U.S.C. §119(e) to U.S. Provisional Patent Application No. 61/438,943, filed Feb. 2, 2011, and U.S. Provisional Patent Application No. 61/471,773, filed Apr. 5, 2011, which are incorporated by reference herein in its entirety.

BACKGROUND

1. Field of Invention

The present invention relates to an illumination system, a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"—direction) while synchronously scanning the substrate parallel or anti parallel to this direction.

It is known to apply particular angular distributions to radiation incident upon the mask or reticle in order to improve the accuracy with which a pattern is projected from the patterning device onto the substrate. The angular distribution is applied to the radiation in an illumination system of the lithographic apparatus. The form of the angular distribution may be visualised and identified most easily as a spatial distribution in a pupil plane of the illumination system. Common illumination modes include annular, dipole and quadrupole.

It is desirable, for example, to provide an illumination system which is capable of forming an illumination mode in a manner which is not disclosed in the prior art.

SUMMARY

According to a first aspect of the invention there is provided an illumination system comprising an array of controllable mirrors configured to direct radiation towards a pupil plane and an array of lenses configured to direct radiation sub-beams towards the array of controllable mirrors, wherein a first lens of the array of lenses and a controllable mirror of the array of controllable mirrors forms a first optical channel having a first optical power and a second lens of the array of lenses and a controllable mirror of the array of controllable mirrors forms a second optical channel having a second optical power, such that a radiation sub-beam formed by the first optical channel has a first cross-sectional area and shape at the pupil plane and a radiation sub-beam formed by the second optical channel has a second different cross-sectional area and/or shape at the pupil plane.

The first optical channel may be one of a group of optical channels which have the first optical power, and the second optical channel may be one of a group of optical channels which have the second optical power.

A third group of optical channels may be formed by a third group of lenses and controllable mirrors, the third group of optical channels being provided with a third optical power such that radiation sub-beams formed by the third group of optical channels have a third different cross-sectional area and/or shape at the pupil plane.

At least one group of lenses or controllable mirrors having the same optical power may be provided adjacent to one another. The group of lenses or controllable mirrors may be provided as a row of lenses or controllable mirrors.

The illumination system may further comprise an additional array of lenses, the additional array of lenses being separated along an optical axis of the illumination system from the array of lenses. The array of lenses of the additional array of lenses may be moveable along an optical axis of the illumination system. A subset of the array of lenses or the additional array of lenses may be moveable along an optical axis of the illumination system.

At least some of the lenses of the array of lenses or the additional array of lenses may be cylindrical lenses.

At least some cylindrical lenses which provide optical power in a first direction may be provided in the array of lenses, and at least some associated cylindrical lenses which provide optical power in a second substantially perpendicular direction may be provided in the additional array of lenses.

The array of controllable mirrors may comprise mirrors of different sizes. Larger mirrors may receive more than one radiation sub-beam. Larger mirrors may be provided in an outer portion of the mirror array.

The array of controllable mirrors may be one of a plurality of arrays of controllable mirrors. A first array of controllable mirrors may be configured to switch radiation sub-beams between mirrors of a second array of controllable mirrors.

At least one of the arrays of controllable mirrors may comprise mirrors which have an optical power which is different to the optical power of mirrors of at least one other array of controllable mirrors.

The array of lenses may be moveable in a direction which is substantially transverse to an optical axis of the illumination system.

The array of lenses may include lenses which are displaced relative to one another in a direction which is substantially parallel to an optical axis of the illumination system.

An aperture array may be located in front of the array of lenses. The size of the apertures of the aperture array may be adjustable.

According to a second aspect of the invention there is provided a lithographic apparatus comprising an illumination system according to any preceding claim, the illumination system being configured to provide a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate.

According to a third aspect of the invention there is provided a method of forming an illumination mode, the method comprising using an array of lenses to separate a radiation beam into radiation sub-beams which are incident upon mirrors of an array of controllable mirrors, and using the array of controllable mirrors to direct the sub-beams of radiation towards a pupil plane, wherein a first lens and a controllable mirror form a first optical channel having a first optical power and a second lens and a controllable mirror form a second optical channel having a second optical power, such that a radiation sub-beam formed by the first optical channel has a first cross-sectional area and shape at the pupil plane and a radiation sub-beam formed by the second optical channel has a second different cross-sectional area and/or shape at the pupil plane.

The illumination system may further comprise an additional array of lenses, and the method further comprising adjusting the cross-sectional areas of the radiation sub-beams by changing the separation between the array of lenses and the additional array of lenses.

According to a fourth aspect of the invention there is provided a device manufactured according to the method of the third aspect of the invention.

According to a fifth aspect of the invention there is provided an illumination system comprising at least two arrays of controllable mirrors for directing radiation towards a pupil plane and at least two associated arrays of lenses configured to direct radiation sub-beams towards the at least two arrays of controllable mirrors, wherein the lenses and controllable mirrors of the first array form optical channels having a first optical power, and the lenses and controllable mirrors of the second array form optical channels having a second optical power, such that radiation sub-beams formed by the first array of lenses and controllable mirrors have a first cross-sectional area and shape at the pupil plane of the illumination system, and radiation sub-beams formed by the second array of lenses and controllable mirrors have a second different cross-sectional area and/or shape at the pupil plane of the illumination system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Where the context allows, the terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support structure can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
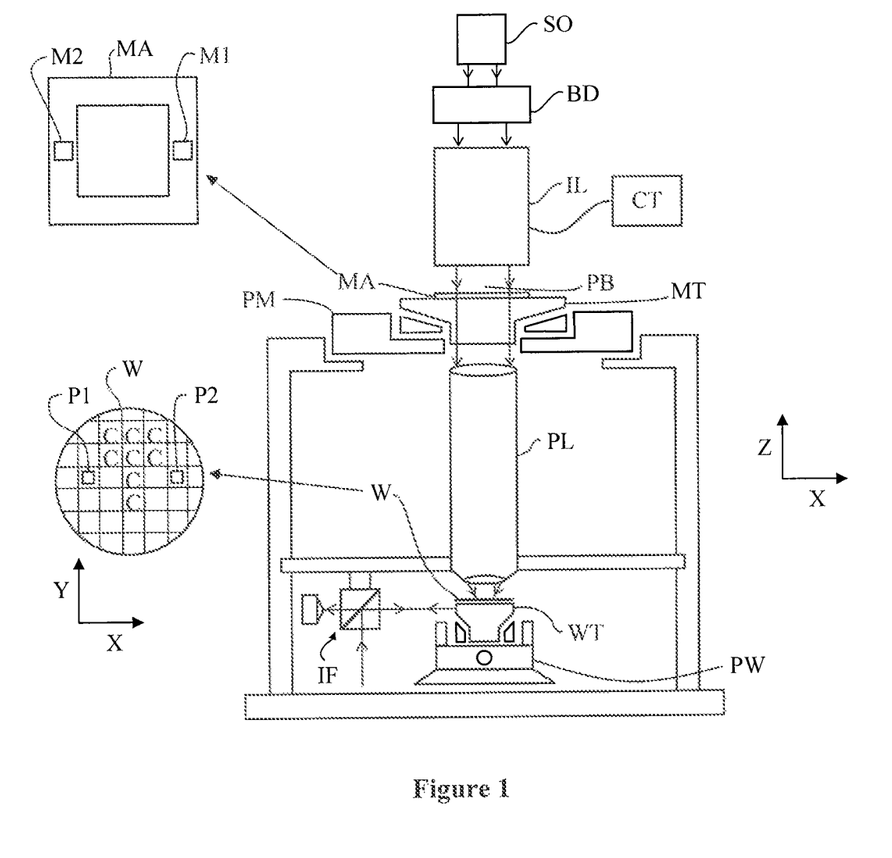
FIG. 1 depicts a lithographic apparatus according to an embodiment of the invention.

FIG. 1 schematically depicts a lithographic apparatus according to a particular embodiment of the invention. The apparatus comprises:

- an illumination system IL to condition a beam PB of radiation (e.g. DUV radiation or EUV radiation).
- a support structure MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or a programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may condition the beam of radiation, for example removing inhomogeneities in the beam using a homogenizer. The illumination system may also form the radiation beam into a desired illumination mode, for example to improve the accuracy with which a pattern is projected from the patterning device MA onto a substrate. Forming the radiation beam into a desired illumination mode is described further below.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The illumination system IL may include a two-dimensional array of mirrors which intersects with the radiation beam PB, and which may be used to direct sub-beams of radiation to desired locations in a pupil plane of the illumination system and thereby form the radiation into a desired illumination mode. Mirror arrays (and associated apparatus) which may be used in this manner are known in the prior art, and are described for example in U.S. Pat. No. 6,737,662 and US 2008/0239268 (both of which are hereby incorporated by reference).

Figure 2:
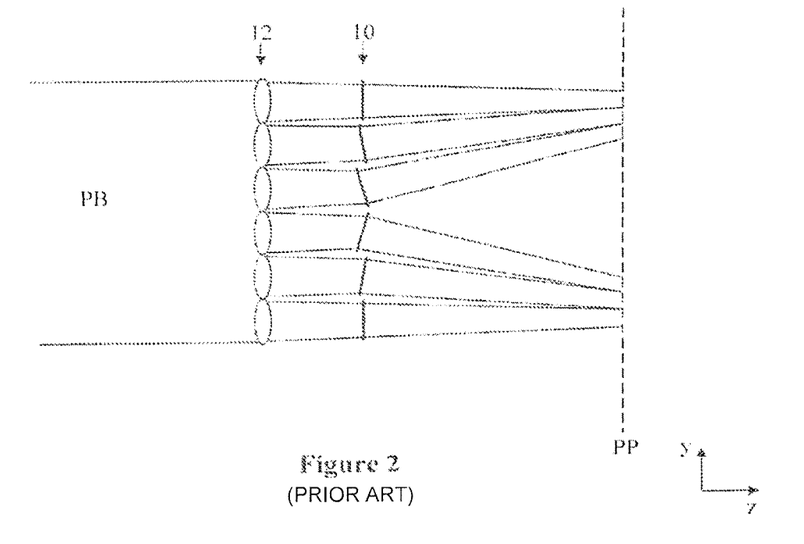
FIG. 2 depicts part of an illumination system of a lithographic apparatus which is known from the prior art.

Because the use of a two-dimensional mirror array to form illumination modes is well known, it is not described in detail here. However, FIG. 2 schematically illustrates operation of a two-dimensional array of mirrors in order to facilitate understanding of the invention. In FIG. 2, a two-dimensional array of mirrors 10 is shown in cross-section together with an associated lens array 12 (also shown in cross-section). Although the mirrors will reflect incident radiation, for ease of illustration the mirrors of the mirror array 10 are shown as being transmissive rather than reflective. A radiation beam PB is incident upon the lens array 12. The lens array 12 separates the radiation beam into six sub-beams, each of which is incident upon a different mirror of the mirror array 10. The mirrors direct the sub-beams towards a pupil plane PP of the illumination system. The upper three mirrors of the mirror array 10 direct the radiation sub-beams upwards, and the lower three mirrors direct the radiation sub-beams downwards. As a result, an upper region in the pupil plane PP is illuminated and a lower region in the pupil plane is also illuminated. A central region of the pupil plane PP is not illuminated by the radiation sub-beams. The orientations of the mirrors may be controlled by a control apparatus CT (shown in FIG. 1).

Figure 3:
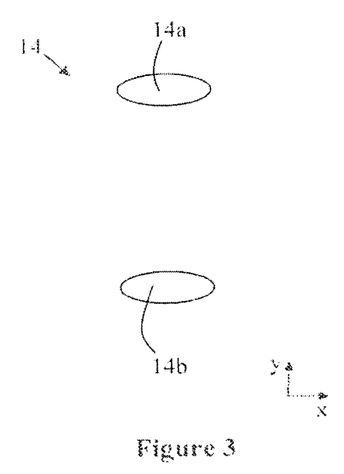
FIGS. 3 and 4 depict illumination modes which may be formed using embodiments of the invention.

FIG. 3 shows the pupil plane PP as viewed from above. The mirrors of the mirror array 10 shown in FIG. 2 direct radiation sub-beams to two particular regions in the pupil plane PP. As may be seen in FIG. 3, this may result in the formation of two regions of radiation 14,b in the pupil plane PP, the two regions of radiation forming a dipole mode 14. The dipole mode 14 may be desirable for example when projecting an image comprising a series of lines from a mask MA to a substrate W.

The array of mirrors 10 shown in cross-section in FIG. 2 may have the same number of mirrors in the x-direction and in the y-direction, and thus may have a total of 36 mirrors. Using this relatively small number of mirrors it may not be possible to form a dipole mode which has the smooth edged form shown in FIG. 3. In practice therefore, an array having a significantly greater number of mirrors may be used (for example the array may have more than 100 mirrors, and may have more than 1000 mirrors).

Figure 4:
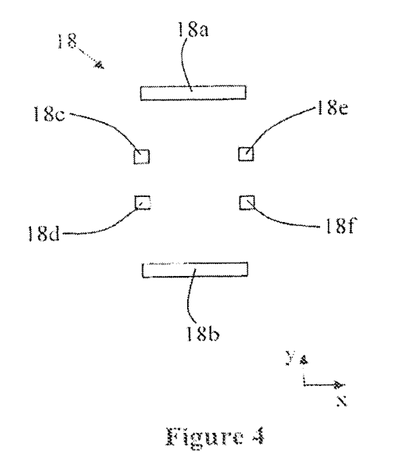

It is desirable to form illumination modes which are more exotic than conventional illumination modes (conventional illumination modes comprising for example annular modes, dipole modes and quadrupole modes). For example, it may be desired to use an illumination mode which includes corners that are rectangular in shape, and/or which includes small rectangular areas of radiation, and/or which includes a rapid transition from an illuminated region to a dark region. A schematic example of an exotic illumination mode is shown in FIG. 4. The exotic illumination mode 18 comprises two rectangles 18a, b and four squares 18c-f. It may not be possible to form an exotic illumination mode such as the one schematically shown in FIG. 4 using a conventional lens array and mirror array, because the sub-beams formed by the lens array and mirror array may not be sufficiently small in cross-section and/or may not have the necessary shape at the pupil plane of the illumination system to form the shapes which make up the exotic illumination mode.

Figure 5:
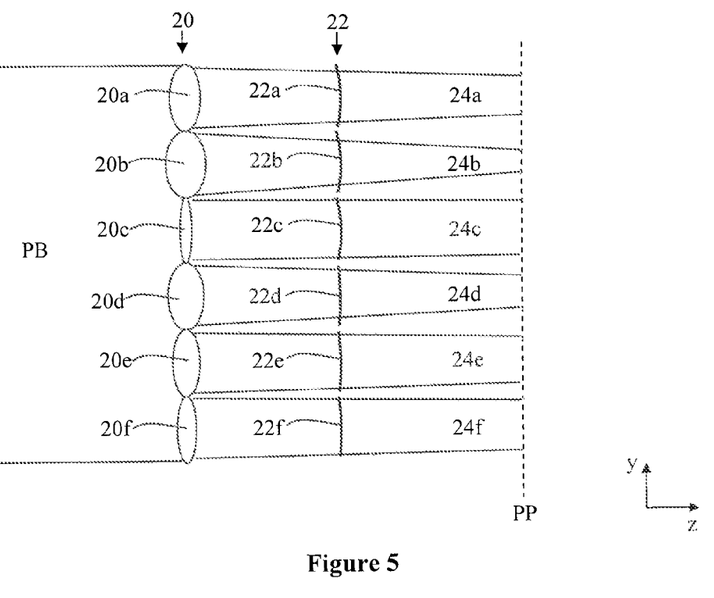
FIG. 5 depicts part of an illumination system of a lithographic apparatus according to an embodiment of the invention.

FIG. 5 schematically represents an embodiment of the invention which may be used to overcome the above problem. In FIG. 5 a lens array 20 and two-dimensional mirror array 22 which may be provided in an illumination system are represented schematically in cross section. The lenses 20a-f of the lens array 20 do not all have the same optical power (as was the case with the lens array shown in FIG. 2), but instead have different optical powers. Similarly, the mirrors 22a-f of the mirrors array 22 are not planar (as was the case with the lens array shown in FIG. 2), but instead have different optical powers. Each lens 20a-f and associated mirror 22a-f may together be considered to form an optical channel, the optical channel modifying the size (and possibly shape) of a radiation sub-beam 24a-f which passes through the optical channel.

The optical channels formed by the lenses 20a-f and mirrors 22a-f have different optical powers. The effect of the different optical powers is represented schematically in FIG. 5, with radiation sub-beams 24a-f formed by different optical channels having different cross-sectional sizes at the pupil plane PP. The cross-sectional sizes of the radiation sub-beams 24a-f are determined by the optical powers of the lenses 20a-f and the optical powers of the mirrors 22a-f, in combination with the size and divergence (etendue) of the radiation beam PB when it is incident upon the lens array 20. The etendue of the radiation beam PB may apply a minimum limit to the radiation sub-beam cross-sectional size that may be achieved.

A radiation sub-beam 24b formed by an optical channel 20b, 22b with strong optical power has a smaller cross-section in the pupil plane PP than a radiation sub-beam 24c formed by an optical channel 20c, 22c with a weak optical power. The radiation sub-beam with the smaller cross-section may for example be used to form a corner (or part of a corner) of an illuminated region 18a-f of the exotic illumination mode 18 shown in FIG. 4.

A radiation sub-beam 24c formed by an optical channel 20c, 22c with a weak optical power has a larger cross-section in the pupil plane PP than other radiation sub-beams, and may for example be used to form part of the interior of an illuminated region 18a-f of the exotic illumination mode 18 (it may fill the interior of the illuminated region more efficiently than sub-beams having smaller cross-sections). It may be desirable to avoid using the radiation sub-beam 24c formed by the optical channel 20c, 22c with weak optical power at edges of illuminated regions as it may not provide sufficiently sharp edges.

In general, radiation sub-beams which have smaller cross-sectional areas will provide better resolution. Radiation sub-beams which have smaller cross-sectional areas may be useful at edges and corners of illuminated regions. Radiation sub-beams which have larger cross-sectional areas may be useful in the interior of illuminated regions, because in addition to filling the interior more efficiently they will reduce the risk of generating ripples of intensity that could be seen if radiation sub-beams having smaller cross-sectional areas were used. A mirror allocation algorithm may be used to determine which radiation sub-beams are used to form different parts of the illumination mode (as explained further below).

The above are merely examples of ways in which radiation sub-beams having different cross-sectional areas in the pupil plane PP may be used to form illumination modes, and the radiation sub-beams may be used to form illumination modes in other ways.

Although only six lenses 20a-f and six associated mirrors 22a-f are shown in FIG. 5, the lens array and associated mirror array may for example comprise more than 100 lenses and associated mirrors, and may for example comprise more than 1000 lenses and associated mirrors. Lenses and mirrors which form optical channels having a plurality of different optical powers may be provided in the arrays. The resulting radiation sub-beams with different cross-sections may be allocated to form an illumination mode (e.g. an exotic illumination mode) which is improved compared with the illumination mode that would be formed using arrays in which all of the lenses and mirrors had the same optical power. In this context the term 'improved' may be interpreted as meaning allowing the lithographic apparatus to project a pattern onto a substrate more accurately than would otherwise be the case. The improved illumination mode may for example have sharper corners, and/or may have smaller features, and/or may have sharper edges than an equivalent illumination mode formed using an array in which all of the optical channels have the same optical power. The improved illumination mode may for example provide a better match with a desired 'ideal' illumination mode generated by a source-mask optimisation algorithm.

The control apparatus CT may use a mirror allocation algorithm to determine which mirrors to use to direct radiation sub-beams to different parts of the illumination mode. The mirror allocation algorithm may take into account the cross-sectional areas of the radiation sub-beams 24a-f when deciding which mirrors of the mirror array 22 should be used to direct radiation sub-beams to different parts of the illumination mode. The cross-sectional areas of the radiation sub-beams 24a-f may be measured during calibration of the illumination system. Additionally/alternatively, the cross sectional areas of the radiation sub-beams 24a-f may be calculated based upon the optical powers of the optical channels 20a-f, 22a-f. The optical powers of the optical channels 20a-f, 22a-f may be stored in a memory in the control apparatus CT. If the lens array 20 modifies the shapes of the radiation sub-beams 24a-f (as discussed below), then the mirror allocation algorithm may also take into account the shapes of the radiation sub-beams. Other properties which may be taken into account by the mirror allocation algorithm include the reflectivity of the mirrors 22a-f of the mirror array 22 and the spatial locations of the mirrors. A detailed description of these and other properties which may be taken into account by the mirror allocation algorithm is included in US2008/0239268 (herein incorporated by reference). The reflectivity of the mirrors of the mirror array 22 may for example be measured by a monitoring apparatus (not shown) which directs radiation sub-beams towards the mirror array and detects the intensity of radiation reflected from the mirror array.

Figure 6:
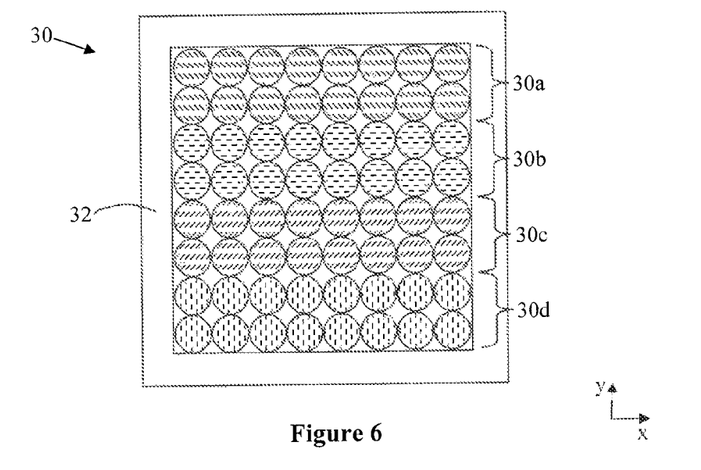
FIG. 6 depicts an array of lenses which form part of an embodiment of the invention.

In an embodiment, groups of adjacent lenses of the lens array may be provided with the same optical powers. An example of this is shown schematically in FIG. 6, which schematically shows a lens array 30 viewed from above. In FIG. 6, the first two rows of lenses 30a are provided with a first optical power, the next two rows of lenses 30b are provided with a second optical power, the next two rows of lenses 30c are provided with a third optical power, and the last two rows of lenses 30d are provided with a fourth optical power. Grouping lenses with the same optical power together in this manner provides the advantage that manufacturing of the lens array 30 may be simplified (compared with manufacturing a lens array in which lenses having the same optical powers are not grouped together). A further advantage is that grouping lenses with the same optical power together may simplify the mirror allocation algorithm used by the control apparatus CT (shown in FIG. 1). A further simplification of the mirror allocation algorithm may be obtained by providing a similar grouping of mirrors having the same optical powers.

Although the rows of lenses 30a-d shown in FIG. 6 extend in the x-direction, the rows of lenses may extend in any direction (e.g. the y-direction).

Although 64 lenses are shown in FIG. 6, this is merely a schematic example and significantly more lenses may be provided in practice. For example, the lens array may comprise 100 or more lenses, or may comprise 1000 or more lenses. Although the array of lenses 30 has lenses with four different optical powers, the array of lenses may have lenses with a different number of optical powers. For example, the array of lenses 30 may have lenses with two different optical powers, three different optical powers, five different optical powers, or more.

The lens array 30 includes a frame 32. The frame 32 may provide the lens array 30 with some structural rigidity, and also allows the lens array to be secured within the illumination system IL of the lithographic apparatus.

Although lenses with particular optical powers 30a-d are grouped together in rows in FIG. 6, this is merely an example and any suitable grouping of lenses of optical powers may be used. For example, the lenses may be grouped in squares or may be grouped in rectangles or in other shapes. More than one group of lenses having a particular optical power may be provided.

Figure 7:
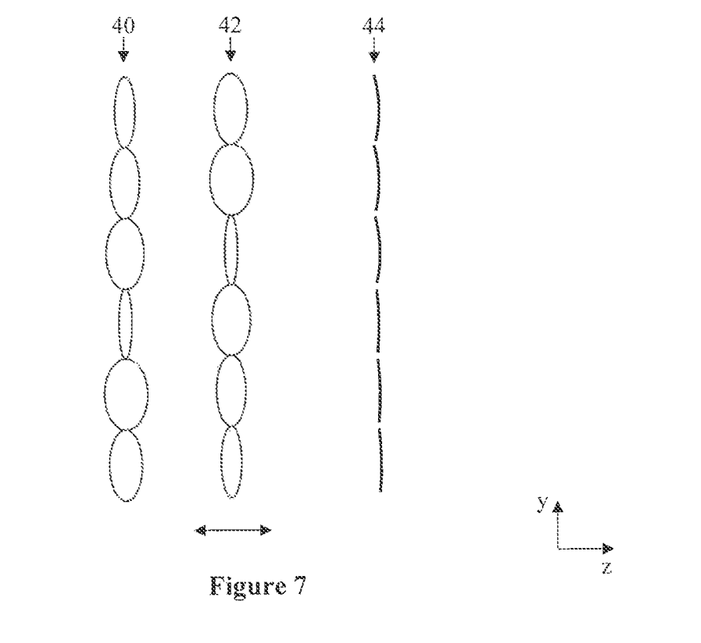
FIG. 7 depicts part of an illumination system of a lithographic apparatus according to an embodiment of the invention.

An alternative embodiment of the invention is illustrated schematically in FIG. 7. In the alternative embodiment a first lens array 40 and a second lens array 42 are provided in front of a mirror array 44 (i.e. such that a radiation beam passes through both lens arrays before being incident upon the mirror array). As in previous figures, the lens arrays 40, 42 and the mirror array 44 are shown in cross-section and are representative of two-dimensional arrays. The mirrors of the mirror array 44 are also provided with different optical powers (represented schematically by showing the mirrors with different curvatures). The optical powers of the lenses of the first and second lens arrays 40, 42 and the optical powers of the mirrors 44 determine the cross-sectional area of radiation sub-beams which they generate in a pupil plane (not shown in FIG. 7) of an illumination system IL.

The second lens array 42 may be moved in the z-direction (i.e. along the optical axis of the illumination system IL), as represented by a double headed arrow. The second lens array 42 may be moved using an actuator (not shown) which may be controlled by the control apparatus CT (shown in FIG. 1). Moving the second lens array 42 to a different position in the z-direction will modify the optical power applied to the radiation sub-beams, and will thus modify the cross-sectional areas of the radiation sub-beams in the pupil plane. Thus, movement of the second lens array 42 in the z-direction provides a degree of control of the cross-sectional areas of radiation sub-beams used to form illumination modes.

The first and second lens arrays 40, 42 may include pairs of lenses (i.e. lenses which collectively act on the same sub-beams of radiation) for which movement of the second lens array in the z-direction has a smaller effect, and pairs of lenses for which movement of the second lens array in the z-direction has a larger effect. For example, two weakly focussing lenses may form a pair of lenses for which movement of the second lens array in the z-direction has a relatively small effect. Two strongly focussing lenses may form a pair of lenses for which movement of the second lens in the z-direction has a relatively strong effect. Arranging pairs of lenses in this way may allow more control of the cross-sectional sizes of radiation sub-beams than would otherwise be the case.

In an embodiment, the first lens array 40 may be moveable in the z-direction in addition to or instead of the second lens array 42 being moveable in the z-direction (e.g. using an actuator which may be controlled by the control apparatus CT).

In an embodiment, instead of moving an entire array of lenses in the z-direction, sub-sets of the array may be independently movable. For example, referring to FIG. 6, each group of lenses having a particular optical power may be moved independently of each other group. Other sub-sets of a lens array may be independently movable.

Referring again to FIG. 7, some or all of the lenses of either or both of the lens arrays 40, 42 may be cylindrical lenses. The cylindrical lenses may be used to modify the shape of radiation sub-beams such that they are for example rectangular in form (or substantially rectangular), or have some other desired shape. In an embodiment, cylindrical lenses which provide focusing in a first direction (e.g. the y-direction) may be provided in the first lens array 40, and cylindrical lenses which provide focusing in a second direction (e.g. the x-direction) may be provided in the second lens array 42. The combined effect of these lens arrays may form radiation sub-beams having desired shapes. The aspect ratios of the shapes may be adjustable by moving the second lens array 42 (or the first lens array 40) in the z-direction. In an embodiment, the first or the second lens array 40, 42 may be provided with some cylindrical lenses which provide focussing in a first direction and some cylindrical lenses which provide focussing in a second direction. In an embodiment, one or more sub-sets of cylindrical lenses may be independently moveable in the z-direction.

In an embodiment, more than two lens arrays may be provided before the mirror array.

As mentioned above, the mirrors of the mirror arrays 22, 44 may be provided with optical powers. For example, the mirrors may have a concave shape (or may have a convex shape). A concave shape may for example be achieved through the application of appropriate coatings and subsequent application of heat to the mirrors during their manufacture (curvature arising through stress generated in the coatings when they are heated). In an embodiment, different mirrors of a mirror array may be provided with different optical powers. Mirrors having different optical powers may for example be grouped together, for example in a manner analogous to that shown in FIG. 6 or in some other manner.

Mirror arrays in which mirrors have different optical powers may be provided in combination with lens arrays in which lenses have different optical powers, or may be provided in combination with lens arrays in which lenses have the same optical powers. Lens arrays in which lenses have different optical powers may be provided in combination with mirror arrays in which mirrors have the same optical powers (or no optical power).

In an embodiment in which the mirrors of the mirror array have optical power, the cross-sectional sizes of the radiation sub-beams in the pupil plane of the illumination system will depend upon the optical powers of the lenses of the lens array(s), the optical powers of the mirrors of the mirror array, and the size and divergence (etendue) of the incident radiation beam. A lens (or lenses) and a mirror may be considered to form an optical channel. The optical power of the optical channel may be considered to be the optical power of the lens (or lenses) combined with the optical power of the mirror.

In an embodiment, more than one mirror array and associated lens array may be provided in the illumination system of the lithographic apparatus, for example in order to provide a sufficiently large surface area to accommodate an entire incident radiation beam. Where this is the case, the optical power of the mirrors of each mirror array may be different. This may be easier to achieve from a manufacturing perspective than providing different mirrors of a single mirror array with different optical powers, since the optical powers may arise from the manner in which the mirror array is processed and it may be difficult to apply different processes to different parts of the same mirror array.

The number of lenses in a lens array may for example be 100 or more, 500 or more or 1000 or more. A corresponding number of mirrors may be provided.

In addition to facilitating the generation of exotic illumination modes, embodiments of the invention may allow conventional illumination modes to be formed more accurately (e.g. with sharper transitions between illuminated regions and dark regions).

In an embodiment, two optical channels may have different optical powers but may still provide radiation sub-beams which have the same cross-sectional area in the pupil plane. This is because the shapes of the radiation sub-beams may differ in such a way that they both have the same cross-sectional area.

In an embodiment, the lenses of the lens array and/or the mirrors of the mirror array may be provided with a plurality of optical powers, the optical powers being selected to allow a variety of different illumination modes to be formed using the mirrors. This will allow the lithographic apparatus to be used in a flexible manner, for example allowing the lithographic apparatus to accurately project a variety of different images onto substrates.

In an embodiment, the lenses of the lens array and/or the mirrors of the mirror array may be provided with a plurality of optical powers, the optical powers being optimised to allow a particular illumination mode to be formed using the mirrors. This may be the case for example if the lithographic apparatus is to be used to project the same pattern onto substrates for a prolonged period of time (as may often be the case). Optimising the optical powers of the lenses of the lens array and/or the mirrors of the mirror array for a particular illumination mode may allow that illumination mode to be formed more accurately than would be case if the optical powers of the lenses and mirrors were arranged to allow a variety of different illumination modes to be formed. The lens array may be held in a frame which is configured to allow the lens array to be removed and replaced with a different lens array in the event that it is desired to use the lithographic apparatus to project a different pattern onto substrates for a prolonged period of time.

Figure 8:
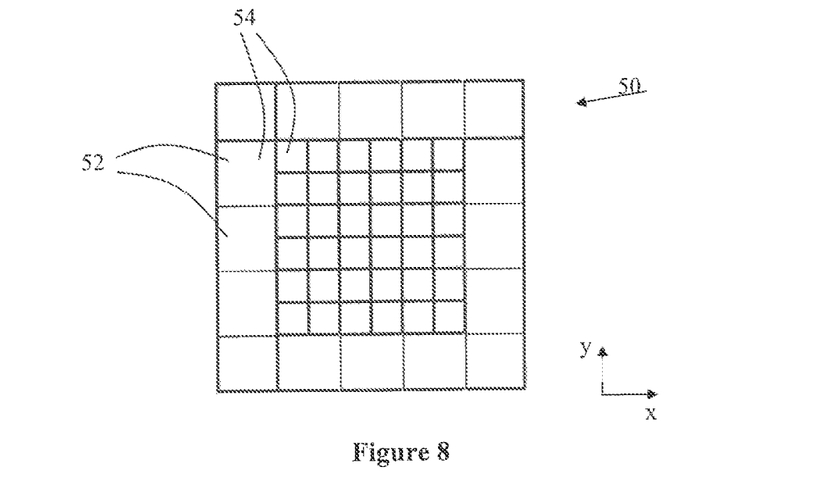
FIG. 8 depicts an array of mirrors which may form part of an embodiment of the invention.

In an embodiment mirrors of the mirror array may have different sizes. In an embodiment, larger mirrors may be provided around part or all of an outer portion of a mirror array. FIG. 8 shows an example of a mirror array 50 in which the mirrors 52,54 are provided in this configuration. Smaller mirrors 54 are provided in an inner portion of the mirror array 50 and larger mirrors 52 are provided in an outer portion of the mirror array. The larger mirrors 52 may receive more than one radiation sub-beam. Although FIG. 8 shows thirty six smaller mirrors and sixteen larger mirrors, any suitable number of mirrors may be provided. More than one ring of larger mirrors may surround the smaller mirrors. In an embodiment larger mirrors may be provided on one or more sides of a mirror array. Providing larger mirrors in an outer portion of the mirror array may reduce cross-talk between the mirrors (compared with the cross-talk that might occur if the larger mirrors were interspersed with the smaller mirrors).

In an embodiment, lenses of one or more lens arrays may have different sizes. The lenses may be arranged in one of the configurations described above in relation to the mirror array, or may be arranged in a different configuration.

In an embodiment, mirrors of a first mirror array may have a first size and mirrors of a second mirror array may have a second size. In an embodiment, lenses of a first lens array may have a first size and lenses of a second lens array may have a second size.

Figure 9:
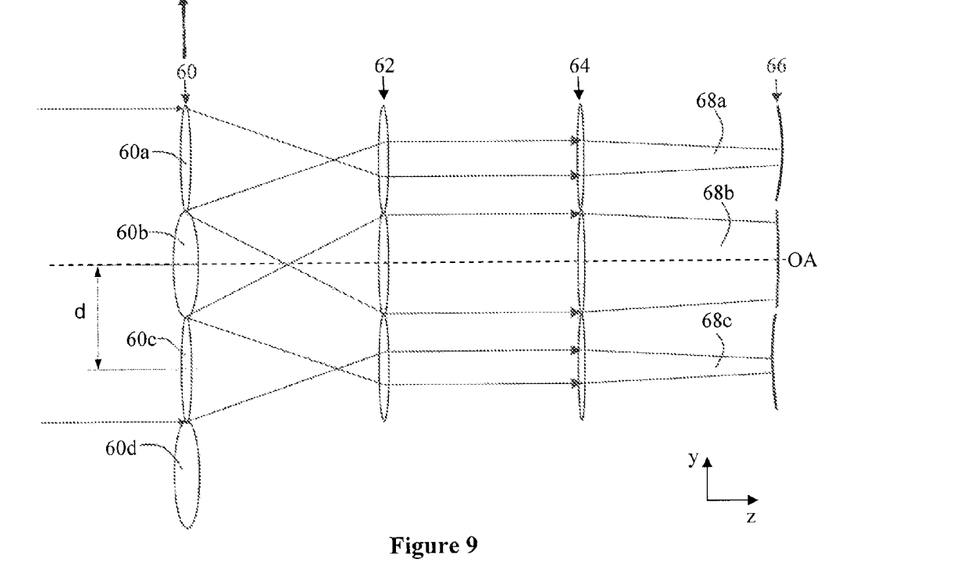
FIG. 9 depicts part of an illumination system of a lithographic apparatus according to an embodiment of the invention in a first configuration.

In an embodiment, a lens array may be moveable in a direction which is substantially transverse to the radiation beam such that lenses of the lens array intersect with different portions of the radiation beam. FIG. 9 shows an embodiment of the invention which comprises a first lens array 60, a second lens array 62, a third lens array 64 and a mirror array 66. The first lens array 60 is moveable in a direction transverse to the optical axis of OA of the lithographic apparatus. In FIG. 9 the movement is in the y-direction, but the movement may be in another suitable direction (e.g. the x-direction). First and third lenses 60a,60c have relatively weak optical powers, whereas second and fourth lenses 60b,60d have relatively strong optical powers. As a result of the differences in optical power, first and third radiation sub-beams 68a,68c have small cross-sections at the mirror array 66, whereas a second radiation sub-beam 68b has a larger cross-section at the mirror array 66. Radiation does not pass through the fourth lens 60d.

Figure 10:
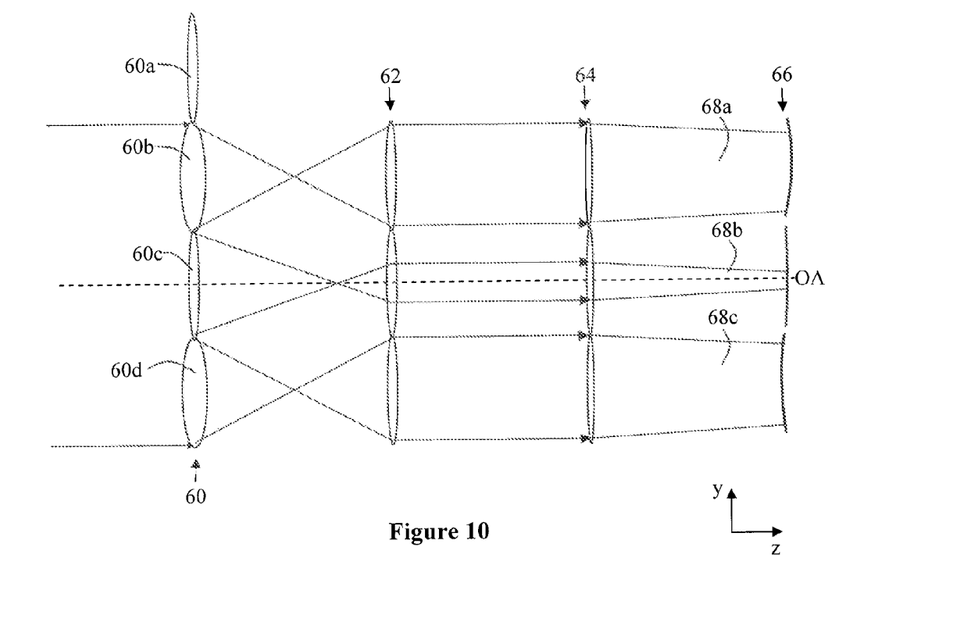
FIG. 10 depicts the apparatus of FIG. 9 in a second configuration.

The first lens array 60 may be moved in the y-direction by a distance d which corresponds to the distance between centres of adjacent lenses. The first lens array 60 may be moved by an actuator (not shown). The effect of moving the lens array by the distance d is shown in FIG. 10. In FIG. 10 the first radiation sub-beam 68a is now formed by the second lens 60b of the first lens array instead of the first lens 60a. As a result, the radiation sub-beam 68a has a larger cross-section at the mirror array 66 than was previously the case. Similarly, the second radiation sub-beam 68b is now formed by the third lens 60c of the first lens array 60, and as a result has a smaller cross-section at the mirror array 66 than was previously the case. The third radiation sub-beam 68c is now formed by the fourth lens 60d. As a result, the third radiation sub-beam 68c has a smaller cross-section at the mirror array 66 than was previously the case.

It may be seen from a comparison of FIGS. 9 and 10 that movement of the first lens array 60 transverse to the optical axis OA allows the cross-sections of the radiation sub-beams at the mirror array 66 to be modified. The lenses of the lens arrays, 60, 62, 64 may be arranged, in combination with optical powers of mirrors of the mirror array 66 (if the mirrors are provided with optical powers) such that moving the first lens array transverse to the radiation beam allows switching between different combinations of radiation sub-beam cross-sections at a pupil plane.

In an embodiment, it may be possible to move the first lens array 60 by a distance other than d. For example, the lens array may be moveable by a distance 2d, 3d or some other distance.

In an embodiment, the second lens array 62 and/or the third lens array 64 may be moveable transverse to the optical axis OA instead of or in addition to the first lens array 60. In an embodiment, the mirror 66 may be moveable transverse to the optical axis OA.

Although the embodiment shown in FIGS. 9 and 10 has a small number of lenses and mirrors, any suitable number of lenses and mirrors may be provided. Although three lens array 60, 62, 64 are shown in FIGS. 9 and 10 any suitable number of lens arrays may be used.

In an embodiment, rows of the lens array may have lenses which are provided with the same optical power (e.g. as shown in FIG. 6). The movement of the lens array may be such that lenses having a given optical power are moved out of intersection with the radiation beam and lenses having a different optical power are moved into intersection with the radiation beam. Referring to FIG. 6 for example, lenses 30a may be moved out of intersection with the radiation beam and lenses 30d may be moved into intersection with the radiation beam (or vice versa).

In an embodiment the mirror array which receives radiation sub-beams from the lens array(s) may be one of a plurality of mirror arrays which receive the radiation sub-beams. For example, a radiation sub-beam may be incident upon a mirror in a first mirror array then incident upon a mirror in a second mirror array. Where this is the case, a mirror in the first mirror array may be used to direct a radiation sub-beam towards different mirrors in a second mirror array by changing the orientation of that mirror. This may for example allow the radiation sub-beam to be directed to a mirror in the second mirror array which applies a first optical power to the radiation sub-beam or to direct the radiation sub-beam to a mirror which applies a second different optical power to the radiation sub-beam (or which has no optical power). Thus, using two or more arrays of mirrors in this manner may allow the cross section of the radiation sub-beam in a pupil plane to be adjusted.

Figure 11:
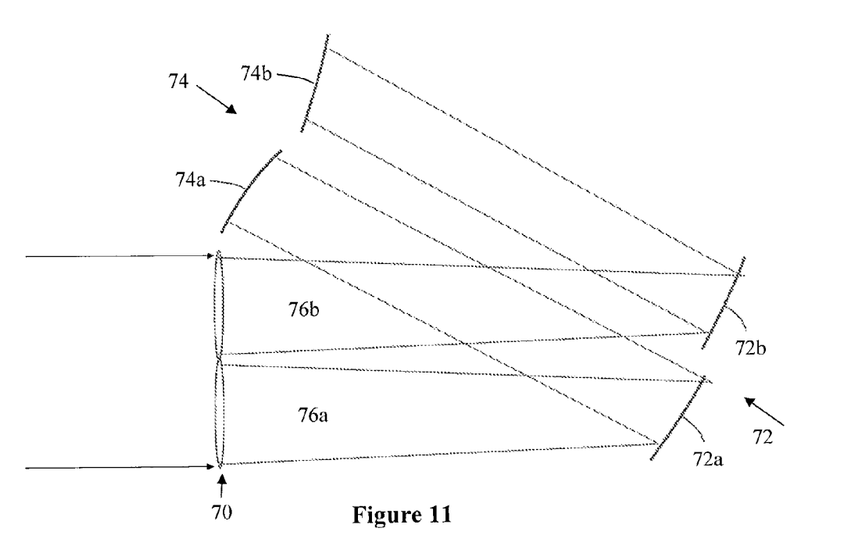
FIG. 11 depicts part of an illumination system of a lithographic apparatus according to an embodiment of the invention in a first configuration.

An example embodiment which uses two mirror arrays is represented schematically in FIG. 11. FIG. 11 shows a lens array 70, a first mirror array 72 and a second mirror array 74. For ease of illustration the lens array 70 includes only two lenses. It will be appreciated that any suitable number of lenses may be included in the lens array. Similarly, although the first mirror array 72 and second mirror array 74 each comprise only two mirrors, the mirror arrays may have any suitable number of mirrors.

In FIG. 11 a first radiation sub-beam 76a is incident upon a first mirror 72a of the first mirror array. The first mirror 72a directs the first radiation sub-beam 76a towards a first mirror 74a of the second mirror array. Similarly, a second radiation beam 76b is incident upon a second mirror 72b of the first mirror array, which directs the radiation sub-beam towards a second mirror 74b of the second mirror array.

Figure 12:
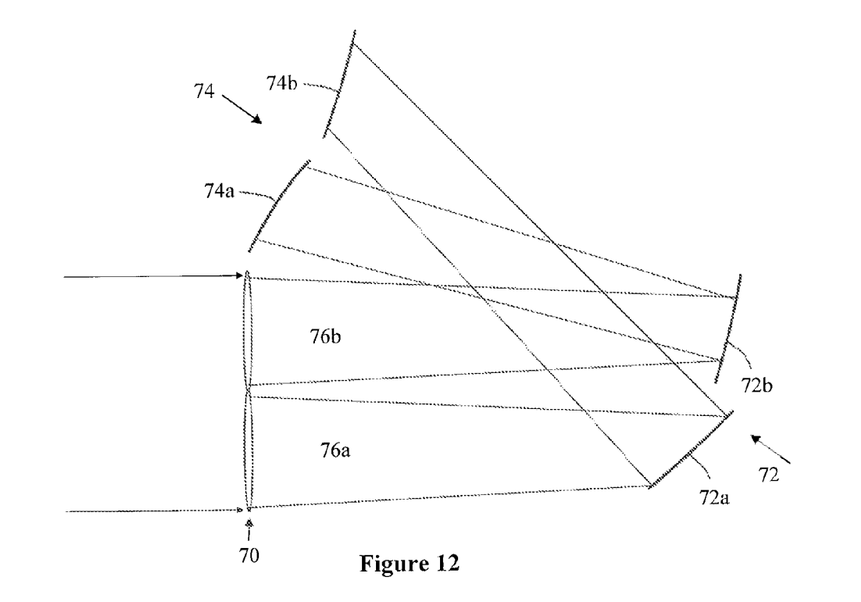
FIG. 12 depicts the apparatus of FIG. 11 in a second configuration.

FIG. 12 shows the same apparatus as FIG. 11 but with the orientations of the mirrors 72a,b of the first mirror array 72 having been changed. The new orientation of the first mirror 72a of the first mirror array is such that it now directs the first radiation sub-beam 76a towards the second mirror 74b of the second mirror array. The new orientation of the second mirror 72b of the first mirror array is such that it now directs the second radiation sub-beam 76b towards the first mirror 74a of the second mirror array.

Switching radiation sub-beams between different mirrors allows the cross-sectional sizes of the radiation sub-beams to be controlled, since the different mirrors may have different optical powers. For example, the first mirror 74a of the second mirror array 74 is more strongly focusing than the second mirror 74b. Thus, directing a radiation sub-beam towards the first mirror 74a instead of the second mirror 74b may reduce the cross-sectional area of the radiation sub-beam in a pupil plane. Other modifications of the cross-sectional area and/or shape of the radiation beam may be performed in a similar manner.

In an embodiment each radiation sub-beam may be incident upon a different mirror in the second mirror array. When the orientations of the mirrors of the first mirror array are changed, this may be done in such a manner than each radiation sub-beam is still incident upon a different mirror of the second mirror array. This is what is shown schematically in the simplified embodiment shown in FIGS. 11 and 12.

In an embodiment, pairs of radiation sub-beams may be allocated to pairs of mirrors in the second mirror array, the first mirror array switching the radiation sub-beams between the pairs of mirrors (e.g. as is shown in FIGS. 11 and 12). In an alternative embodiment three radiation sub-beams may be allocated to three mirrors in the second mirror array in a similar manner, the radiation sub-beams being switched between those three mirrors. The same approach may be applied for our or more mirrors in the second mirror array.

In an embodiment, the orientations of the mirrors of the first mirror array may be such that in some instances more than one radiation sub-beam is simultaneously incident upon a mirror in the second mirror array.

Figure 13:
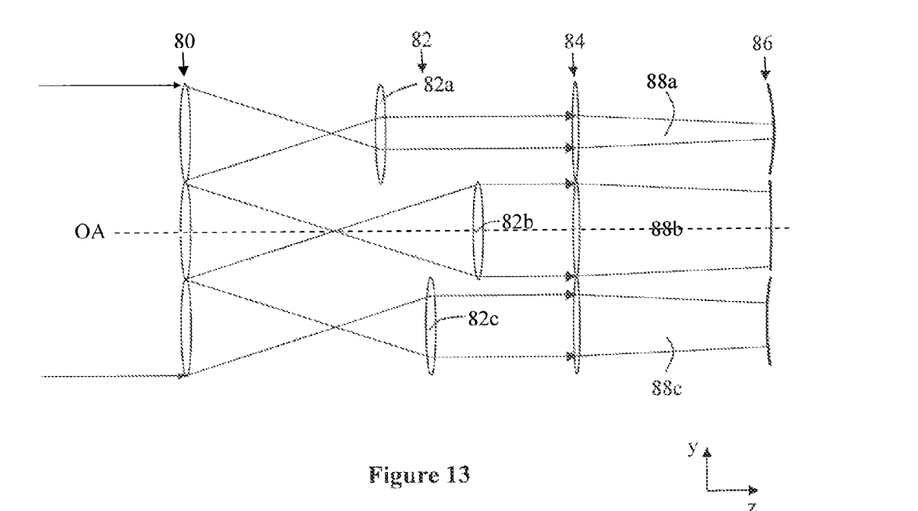
FIG. 13 depicts part of an illumination system of a lithographic apparatus according to an embodiment of the invention.

In an embodiment, lenses in one of the lens arrays may displaced from one another along the optical axis. This may allow desired modifications of the cross-sectional size of radiation sub-beams to be achieved using lenses which have smaller variations in optical power (or using lenses which have the same optical power). An example of one way in which this may be achieved is illustrated in FIG. 13. In FIG. 13 three lens arrays 80, 82, 84 are shown and a mirror array 86 is also shown. The lenses of each lens array all have the same optical power. However, the lenses of the second lens array 82 have different positions in the z-direction. A first lens 82a of the second lens array is located nearest to the first lens array 80, and as a result a first radiation sub-beam 88a has a small cross-sectional area at the mirror array 86. A third lens 82b of the second lens array is located further from the first lens array 80, and as a result a third radiation sub-beam 88c has a larger cross-sectional area at the mirror array 86. A second lens 82c of the second lens array is located still further from the first lens array 80, and as a result a second radiation sub-beam 88b has a still larger cross-sectional area at the mirror array 86.

Figure 14:
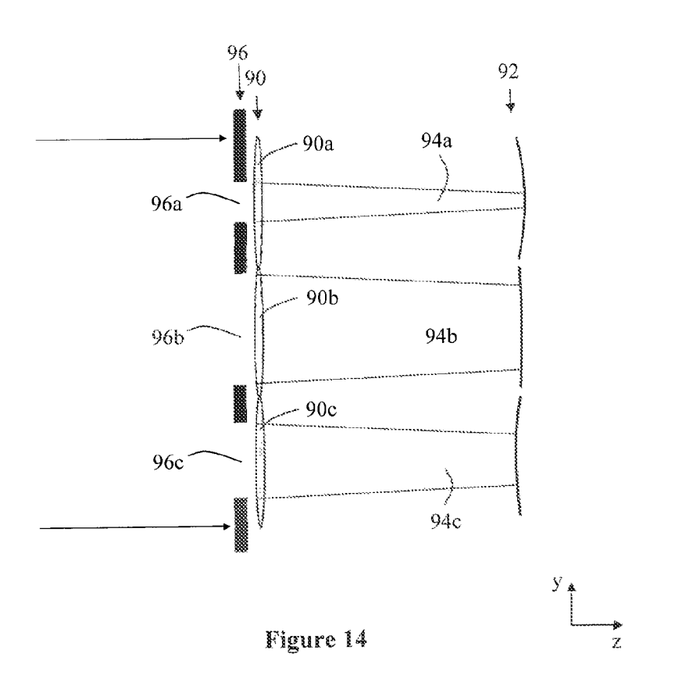
FIG. 14 depicts part of an illumination system of a lithographic apparatus according to an embodiment of the invention.

In an embodiment an aperture associated with a lens of a lens array may be used to reduce the cross-sectional area of a radiation beam which passes through the lens. Apertures may be associated with a plurality of lenses of a lens array. The sizes of the apertures may be adjustable. An example of one way in which apertures may be associated with lenses is illustrated in FIG. 14. In FIG. 14 a lens array 90 comprising three lenses 90a-c is shown together with a mirror array 92. An aperture array 96 is located in front of the lens array 90. The aperture array defines a plurality of apertures 96a-c, each of which is associated with a lens 90a-c of the lens array 90. The apertures 96a-c determine the diameter of the radiation beam which is incident upon each lens 90a-c of the lens array 90. The apertures 96a-c thus influence the diameters of the radiation sub-beams 94a-c that travel to the mirror array 92 (as is represented schematically in FIG. 14). The sizes of the apertures may be adjustable.

Cartesian coordinates are used in the above description to facilitate description of embodiments of the invention. The Cartesian coordinates are not intended to imply that features of the invention must have particular orientations.

While specific embodiments of the invention have been described above, it will be appreciated that the invention may be practiced otherwise than as described. The description is not intended to limit the invention.

The invention claimed is:

1. An illumination system comprising an array of controllable mirrors configured to direct radiation towards a pupil plane and an array of lenses configured to direct radiation sub-beams towards the array of controllable mirrors,
   wherein a first lens of the array of lenses and a controllable mirror of the array of controllable mirrors forms a first optical channel having a first optical power and a second lens of the array of lenses and a controllable mirror of the array of controllable mirrors forms a second optical channel having a second optical power, and
   wherein the first optical power is different from the second optical power.

2. The illumination, system of claim 1, wherein the first optical channel is one of a group of optical channels which have the first optical power, and wherein the second optical channel is one of a group of optical channels which have the second optical power.

3. The illumination system of claim 2, wherein a third group of optical channels is formed by a third group of lenses and controllable mirrors, the third group of optical channels being provided with a third optical power such that radiation sub-beams formed by the third group of optical channels have a third different cross-sectional area and/or shape at the pupil plane.

4. The illumination system of claim 2, wherein at least one group of lenses or controllable mirrors having the same optical power are provided adjacent to one another.

5. The illumination system of claim 4, wherein the group of lenses or controllable mirrors is provided as a row of lenses or controllable mirrors.

6. The illumination system of claim 1, wherein the illumination system further comprises an additional array of lenses, the additional array of lenses being separated along an optical axis of the illumination system from the array of lenses.

7. The illumination system of claim 6, wherein the array of lenses of the additional array of lenses is moveable along an optical axis of the illumination system.

8. The illumination system of claim 7, wherein a subset of the array of lenses or the additional array of lenses is moveable along an optical axis of the illumination system.

9. The illumination system of claim 1, wherein at least some of the lenses of the array of lenses or an additional array of lenses are cylindrical lenses.

10. The illumination system of claim 9, wherein at least some cylindrical lenses which provide optical power in a first direction are provided in the array of lenses, and at least some associated cylindrical lenses which provide optical power in a second substantially perpendicular direction are provided in the additional array of lenses.

11. The illumination system of claim 1, wherein the array of controllable mirrors is one of a plurality of arrays of controllable mirrors.

12. The illumination system of claim 11, wherein at least one of the arrays of controllable mirrors comprises mirrors which have an optical power which is different to the optical power of mirrors of at least one other array of controllable mirrors.

13. The illumination system of claim 1, wherein the array of lenses comprises two lenses that have different optical powers.

14. A lithographic apparatus comprising:
   an illumination system configured to provide a beam of radiation comprising:
      an array of controllable mirrors configured to direct radiation towards a pupil plane and an array of lenses configured to direct radiation sub-beams towards the array of controllable mirrors,
      wherein a first lens of the array of lenses and a controllable mirror of the array of controllable mirrors forms a first optical channel having a first optical power and a second lens of the array of lenses and a controllable mirror of the array of controllable mirrors forms a second optical channel having a second optical power, and
      wherein the first optical power is different from the second optical power;
   a support structure for supporting a patterning device, the patterning device serving to impart the radiation beam with a pattern in its cross-section;

a substrate table for holding a substrate; and
a projection system for projecting the patterned radiation beam onto a target portion of the substrate.

15. The lithographic apparatus of claim 14, wherein
the first optical channel is one of a first group of optical channels which have the first optical power, and
the second optical channel is one of a second group of optical channels which have the second optical power.

16. The lithographic apparatus of claim 15, wherein a third group of optical channels is formed by a third group of lenses and controllable mirrors, the third group of optical channels being provided with a third optical power such that radiation sub-beams formed by the third group of optical channels have a third different cross-sectional area and/or shape at the pupil plane.

17. The lithographic apparatus of claim 16, wherein at least one group of lenses and controllable mirrors having the same optical power are provided adjacent to one another.

18. The lithographic apparatus of claim 16, wherein at least one group of lenses and controllable mirrors is provided as a row of lenses and controllable mirrors.

19. The lithographic apparatus of claim 14, further comprising an additional array of lenses, the additional array of lenses being separated along an optical axis of the illumination system from the array of lenses.

20. The lithographic apparatus of claim 19, wherein the array of lenses or the additional array of lenses is moveable along an optical axis of the illumination system.

21. The lithographic apparatus of claim 19, wherein a subset of the array of lenses or the additional array of lenses is moveable along an optical axis of the illumination system.

22. The lithographic apparatus of claim 19, wherein at least some of the lenses of the array of lenses or the additional array of lenses are cylindrical lenses.

23. The lithographic apparatus of claim 22, wherein at least some cylindrical lenses which provide optical power in a first direction are provided in the array of lenses, and at least some associated cylindrical lenses which provide optical power in a second substantially perpendicular direction are provided in the additional array of lenses.

24. The lithographic apparatus of claim 14, wherein the array of controllable mirrors is one of the plurality of arrays of controllable mirrors.

25. The lithographic apparatus of claim 24, wherein at least one of the arrays of controllable mirrors comprises mirrors which have an optical power which is different to the optical power of mirrors of at least one other array of controllable mirrors.

26. An illumination system comprising at least two arrays of controllable mirrors for directing radiation towards a pupil plane and at least two associated arrays of lenses configured to direct radiation sub-beams towards the at least two arrays of controllable mirrors;
(a) wherein the lenses and controllable mirrors of the first array form optical channels having a first optical power, and the lenses and controllable mirrors of the second array form optical channels having a second optical power, such that radiation sub-beams formed by the first array of lenses and controllable mirrors have a first cross-sectional area and shape at the pupil plane of the illumination system, and radiation sub-beams formed by the second array of lenses and controllable mirrors have a second different cross-sectional area and/or shape at the pupil plane of the illumination system, and
wherein the first optical power is different from the second optical power.

27. A method of forming an illumination mode, the method comprising:
using an array of lenses to separate a radiation beam into radiation sub-beams which are incident upon mirrors of an array of controllable mirrors, and
using the array of controllable mirrors to direct the sub-beams of radiation towards a pupil plane;
wherein a first lens and a controllable mirror form a first optical channel having a first optical power and a second lens and a controllable mirror form a second optical channel having a second optical power, and wherein the first optical power is different from the second optical power.

28. The method of claim 27, further comprising adjusting the cross-sectional areas of the radiation sub-beams by changing the separation between the array of lenses and an additional array of lenses, wherein the additional array of lenses is separated along an optical axis of an illumination system.

* * * * *